(12) United States Patent
Ghannouchi et al.

(10) Patent No.: US 6,255,908 B1
(45) Date of Patent: Jul. 3, 2001

(54) TEMPERATURE COMPENSATED AND DIGITALLY CONTROLLED AMPLITUDE AND PHASE CHANNEL AMPLIFIER LINEARIZER FOR MULTI-CARRIER AMPLIFICATION SYSTEMS

(75) Inventors: Fadhel Ghannouchi; Said Touimer, both of Montréal; François Beauregard, Laprairie; Ammar B. Kouki, Montréal, all of (CA)

(73) Assignee: Amplix, Montreal (CA)

( * ) Notice: Subject to any disclaimer, the term of this patent is extended or adjusted under 35 U.S.C. 154(b) by 0 days.

(21) Appl. No.: 09/389,511

(22) Filed: Sep. 3, 1999

(51) Int. Cl.[7] ..................................................... H03F 11/26
(52) U.S. Cl. ........................................... 330/149; 330/145
(58) Field of Search ..................................... 330/149, 284, 330/289, 144, 145; 375/296, 297

(56) References Cited

U.S. PATENT DOCUMENTS

| | | | |
|---|---|---|---|
| 4,112,399 | 9/1978 | Pracher et al. | 335/106 |
| 4,122,399 | 10/1978 | Heiter et al. | 330/149 |
| 4,157,508 | 6/1979 | Hecken | 328/142 |
| 4,283,684 | 8/1981 | Satoh | 330/277 |
| 4,329,655 | 5/1982 | Nojima et al. | 330/149 |
| 4,564,816 | 1/1986 | Kumar et al. | 30/149 |
| 4,588,958 | 5/1986 | Katz et al. | 330/149 |
| 4,698,597 | 10/1987 | Merli et al. | 328/163 |
| 4,752,743 | 6/1988 | Pham et al. | 330/149 |
| 4,878,030 | 10/1989 | Vincze | 330/149 |
| 4,902,983 | 2/1990 | Fujiki et al. | 330/149 |
| 4,987,378 | 1/1991 | Eggleston et al. | 330/149 |
| 5,015,965 | * 5/1991 | Katz et al. | 330/149 |
| 5,038,113 | 8/1991 | Katz et al. | 330/277 |
| 5,049,832 | 9/1991 | Cavers | 330/149 |
| 5,138,275 | 8/1992 | Abbiati et al. | 330/149 |
| 5,146,117 | 9/1992 | Larson | 307/465 |
| 5,291,148 | * 3/1994 | Reisner et al. | 330/149 |
| 5,523,716 | 6/1996 | Grebliunas et al. | 330/149 |
| 5,576,660 | 11/1996 | Pouysegur et al. | 330/149 |
| 6,107,877 | * 8/2000 | Miguelez et al. | 330/149 X |

* cited by examiner

Primary Examiner—Steven J. Mottola
(74) Attorney, Agent, or Firm—Quarles & Brady LLP

(57) ABSTRACT

A linearizer channel amplifier for use in conjunction with a power amplifier comprises an input series circuit formed of a first variable attenuator, an input drive amplifier and a power limiter, and an output series circuit formed of a second variable attenuator and an output drive amplifier. Between the input and output series circuits is interposed a linearizer. In this linearizer, a splitter produces first and second signal portions, a first path comprises serially interconnected predistorter and third variable attenuator for distorting and adjusting the amplitude of the first signal portion, a second path comprises serially interconnected phase shifter and fourth variable attenuator for phase-shifting and adjusting the amplitude of the second signal portion, and a combiner combines the distorted and amplitude-adjusted first signal portion and the phase-shifted and amplitude-adjusted second signal portion to form a predistorted output signal applied to the output series circuit. A digital controller includes a processor for measuring the level of a temperature of operation of the power amplifier through an interface, and a look-up table for storing predistortion control parameters related to different levels of the temperature of operation. The processor is connected to the look-up table for selecting predistortion control parameters in relation to the measured temperature level, and for applying through a D/A converter and a signal conditioner the selected predistortion control parameters to the first, second, third and fourth variable attenuators and to the phase shifter in view of producing a predistorted output signal which cancels a distortion subsequently produced by the power amplifier.

11 Claims, 8 Drawing Sheets

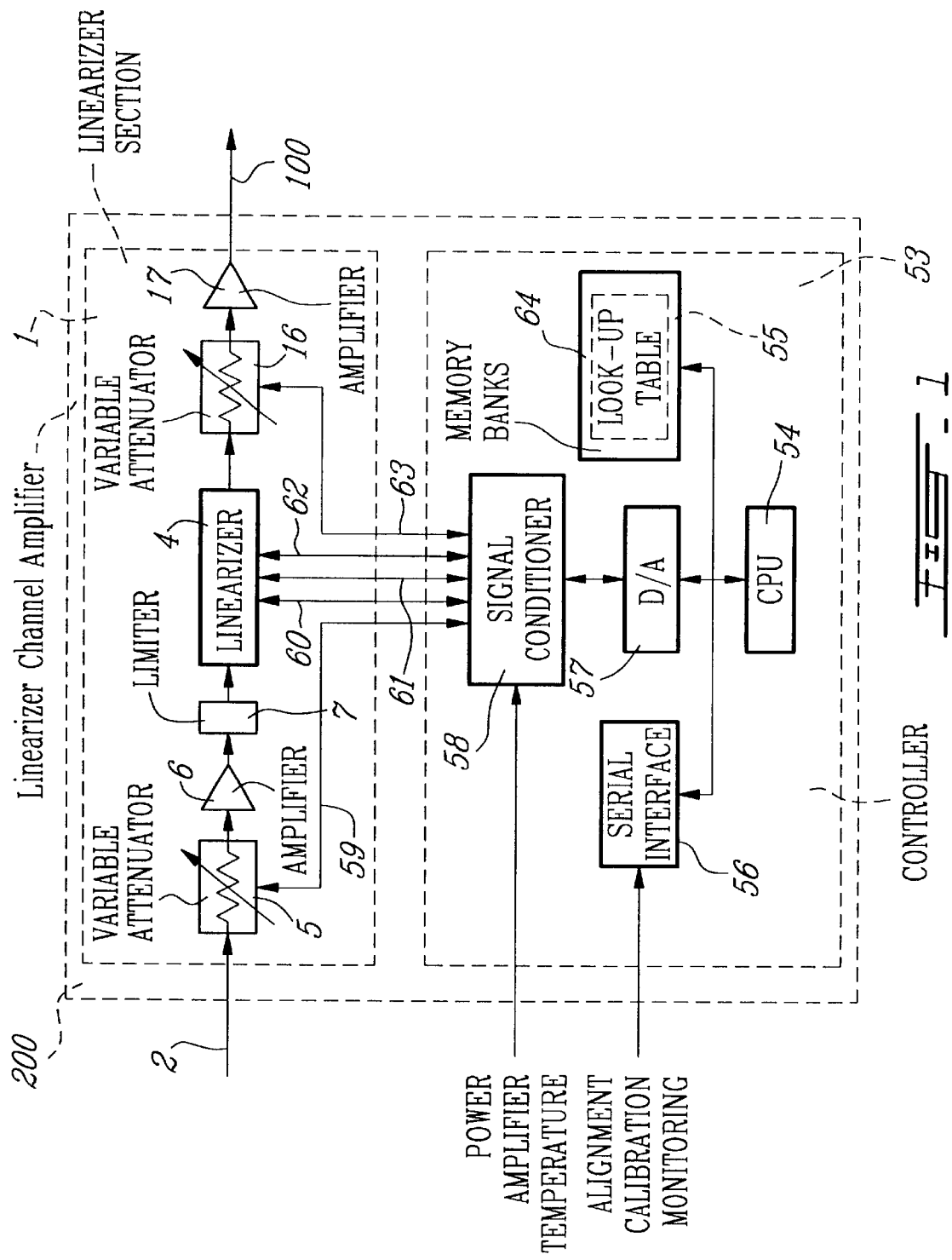

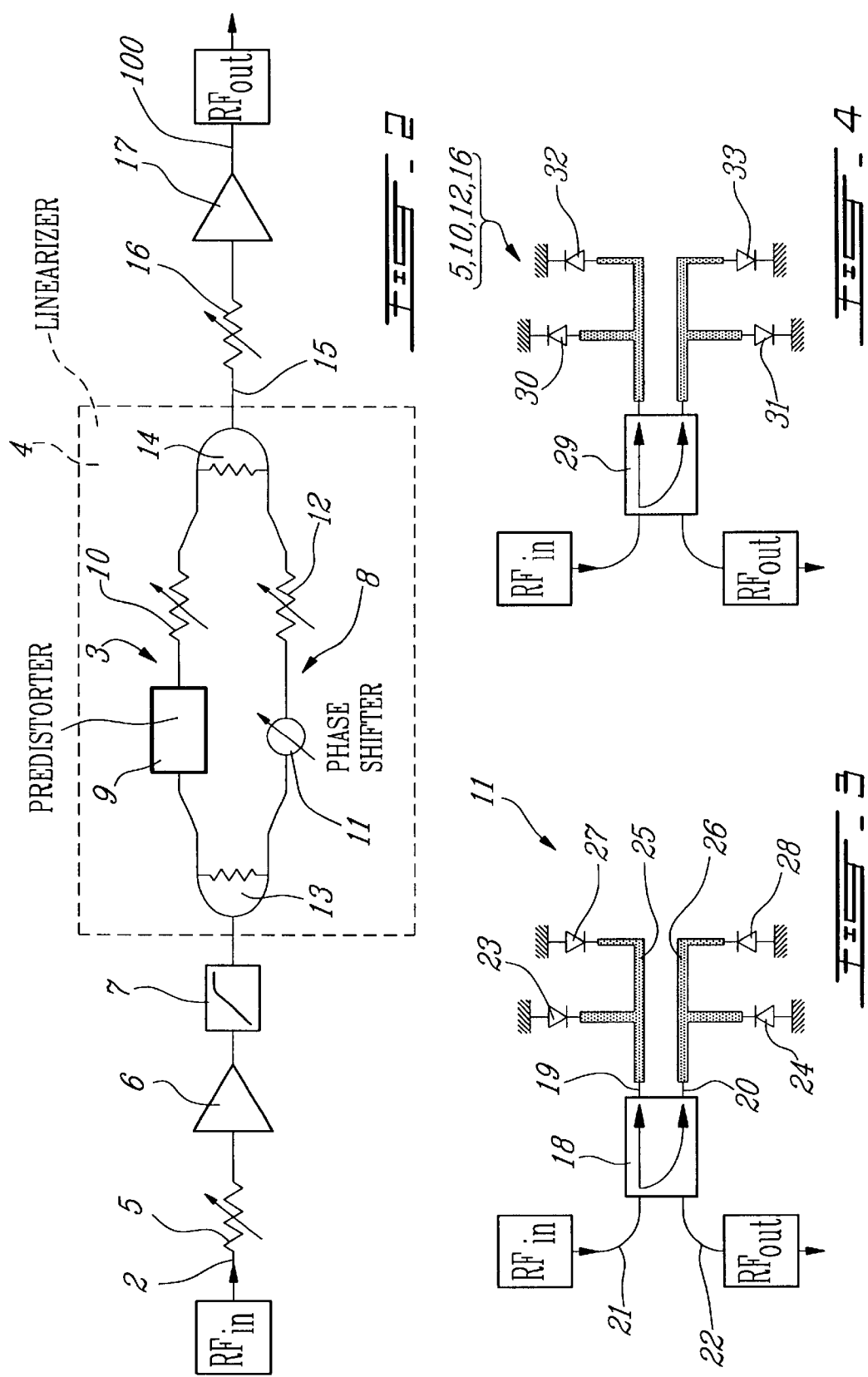

TEMPERATURE COMPENSATED AND DIGITALLY CONTROLLED AMPLITUDE AND PHASE CHANNEL AMPLIFIER LINEARIZER FOR MULTI-CARRIER AMPLIFICATION SYSTEMS

BACKGROUND OF THE INVENTION

1. Field of the Invention

The present invention relates to a linearizer for use in conjunction with a power amplifier, and to a linearizer channel amplifier using this linearizer for predistorting an input signal in view of cancelling signal distortions subsequently produced by the power amplifier.

2. Brief Description of the Prior Art

Microwave power amplifiers (solid state or travelling wave amplifiers) used in ground station transmitters and communication satellites should ideally be highly efficient and provide linear amplification over a wide range of input power. Obviously, the performance of these microwave power amplifiers is limited by the non-linearities of the inner parts or constituents. A wide variety of correction methods for microwave power amplifier's non-linearities have been proposed and implemented (e.g., power back-off, negative feedback, feed forward, etc.). However, in most cases the efficiency of the linearized amplifier drops significantly relatively to the efficiency of the non-linearized amplifier specially when this amplifier input is a high crest factor modulated signal such as a CDMA (Code Division Multiple Access), NPR (Noise Power Ratio), or other types of signals.

Predistortion is one of the best cost-effective approaches to reduce the level of non-linear distortion generated by microwave power amplifiers. Predistortion consists of introducing in the input microwave signal amplitude and phase distortion opposite to the distortion produced by the microwave power amplifier to thereby cancel any distortion and obtain at the output of the power amplifier a signal that is an amplified replica of the input signal with almost no power efficiency decrease. Therefore, the function of a predistorter circuit is to generate both inverse amplitude and phase non-linearities. Since the characteristics of a microwave power amplifier significantly change with temperature, the predistortion circuit has to maintain the overall performance of linearity of the system and to follow the amplifier changes.

OBJECT OF THE INVENTION

An object of the present invention is therefore to provide a linearizer for use in conjunction with power amplifiers, and to provide a linearizer channel amplifier using this linearizer for predistorting an input signal in view of cancelling signal distortion subsequently produced by the power amplifier.

SUMMARY OF THE INVENTION

More specifically, in accordance with the present invention, there is provided a linearizer channel amplifier for use in conjunction with a power amplifier, comprising a linearizer which comprises:

a) a splitter for splitting an input signal into first and second signal portions;

b) a first controllable signal-distorting and amplitude-adjusting path for distorting and adjusting the amplitude of said first signal portion;

c) a second controllable phase-shifting and amplitude-adjusting path for phase-shifting and adjusting the amplitude of said second signal portion; and d) a combiner for combining the distorted and amplitude-adjusted first signal portion and the phase-shifted and amplitude-adjusted second signal portion to form a predistorted output signal;

whereby the predistorted output signal cancels a distortion subsequently produced by the power amplifier.

In accordance with preferred embodiments of the linearizer channel amplifier, the first path comprises a predistorter connected in series with a variable attenuator, the first path is a non-linear path and the variable attenuator is a controllable variable attenuator, the second path comprises a phase shifter connected in series with a variable attenuator, and the second path is a linear path, the phase shifter is a controllable phase shifter and the variable attenuator is a controllable variable attenuator.

The present invention also relates to a linearizer channel amplifier for use in conjunction with a power amplifier, comprising:

a) a controllable input variable-attenuator, drive-amplifier and power-limiter circuit for attenuating an input signal, amplifying the input signal and limiting the power of said input signal;

b) a linearizer comprising:
   i) splitter for splitting into first and second signal portions the attenuated, amplified and power-limited input signal from the input variable-attenuator, drive-amplifier and power-limiter circuit;
   ii) a first controllable signal-distorting and amplitude-adjusting path for distorting and adjusting the amplitude of said first signal portion;
   iii) a second controllable phase-shifting and amplitude-adjusting path for phase-shifting and adjusting the amplitude of said second signal portion; and
   iv) a combiner for combining the distorted and amplitude-adjusted first signal portion and the phase-shifted and amplitude-adjusted second signal portion to form a predistorted output signal;

c) a controllable output variable-attenuator and drive-amplifier circuit for attenuating the predistorted output signal and amplifying said predistorted output signal before supplying said predistorted output signal to said power amplifier; and d) a controller for controlling the first and second paths in view of distorting and amplitude-adjusting the first signal portion and phase-shifting and amplitude-adjusting the second signal portion so as to produce a predistorted output signal which cancels a distortion subsequently produced by the power amplifier.

In accordance with preferred embodiments of the linearizer channel amplifier:

the first path comprises a predistorter connected in series with a first variable attenuator, and the second path comprises a phase shifter connected in series with a second variable attenuator;

the first path is a non-linear path, and the first variable attenuator is a first controllable variable attenuator, and the second path is a linear path, the phase shifter is a controllable phase shifter, and the second variable attenuator is a second controllable variable attenuator;

the controllable input variable-attenuator, drive-amplifier and power-limiter circuit comprises a third controllable variable attenuator, an input drive amplifier and a power limiter connected in series, and the controllable output variable-attenuator and drive-amplifier circuit comprises a fourth controllable variable attenuator connected in series with an output drive amplifier;

the controller is a digital controller comprising:
  means for measuring the level of a condition of operation of the power amplifier;
  means for selecting predistortion control parameters in relation to the measured level of the condition of operation; and
  means for applying the selected predistortion control parameters to the controllable input and output circuits and to the first and second controllable paths in view of producing a predistorted output signal which cancels a distortion subsequently produced by said power amplifier;
the predistortion control parameter selecting means comprises:
  a look-up table for storing predistortion control parameters associated to different levels of said condition of operation; and
  means connected to the look-up table for selecting predistortion control parameters in relation to the measured level of the condition of operation.

In accordance with a more specific preferred embodiment of the present invention, the digital controller comprises:
  a processor for measuring the level of a temperature of operation of the power amplifier through an interface;
  a look-up table for storing predistortion control parameters related to different levels of the temperature of operation; and
  the processor being connected to the look-up table for selecting predistortion control parameters in relation to the measured temperature level, and for applying through a digital-to-analog converter and a signal conditioner the selected predistortion control parameters to the first, second, third and fourth controllable variable attenuators and to the controllable phase shifter in view of producing a predistorted output signal which cancels a distortion subsequently produced by the power amplifier.

A linearizer channel amplifier comprising a processor and a look-up table in which are stored predistorter control parameters associated to different temperatures of operation of the power amplifier, can be easily designed for compensating for non-linearities of a wide range of power amplifiers in a wide range of environmental conditions.

In accordance with another aspect of the invention, there is provided a method for predistorting an input signal before supplying the input signal to a power amplifier, comprising:
  a) splitting the signal into first and second signal portions;
  b) controllably distorting and adjusting the amplitude of said first signal portion;
  c) controllably phase-shifting and adjusting the amplitude of said second signal portion; and
  d) combining the distorted and amplitude-adjusted first signal portion and the phase-shifted and amplitude-adjusted second signal portion to form a predistorted output signal;
whereby the distorted output signal cancels a distortion subsequently produced by the power amplifier.

In accordance with a preferred embodiment of the invention, there is provided a method for designing and calibrating a linearizer channel amplifier for use in conjunction with a power amplifier, comprising:
  a) choosing a predistorter configuration according to the distortion nature of the power amplifier;
  b) determining a first set of parameters for the predistorter;
  c) optimizing a second set of parameters for a set of RF components of the linearizer channel amplifier, to synthesise characteristics of ideal predistortion curves;
  d) determining a set of AM/AM and AM/PM characteristics of the power amplifier for a given temperature;
  e) calculating ideal predistortion AM/AM and AM/PM curves;
  f) using the second set of parameters, calculating a modified second set of parameters to fit the ideal predistortion curves for the given temperature;
  g) storing the modified second set of parameters for the given temperature in a look-up table;
  h) incrementing the temperature by a given value; and
  i) repeating steps d) to h) until a maximum temperature value is reached.

The objects, advantages and other features of the present invention will become more apparent upon reading of the following non-restrictive description of preferred embodiments thereof, given by way of example only with reference to the accompanying drawings.

BRIEF DESCRIPTION OF THE DRAWINGS

In the appended drawings

FIG. 1 is a schematic block diagram of a digital-controlled amplitude and phase linearizer channel amplifier comprising linearizer and controller sections according to the present invention;

FIG. 2 is a schematic circuit diagram of the linearizer section of FIG. 1, comprising a linearizer itself including a phase shifter, attenuators and a predistorter;

FIG. 3 is the circuit diagram of a preferred embodiment of the phase shifter of the linearizer section of FIG. 2;

FIG. 4 is the circuit diagram of a preferred embodiment of the attenuators of the linearizer section of FIG. 2;

DETAILED DESCRIPTION OF THE PREFERRED EMBODIMENT

Figure 5A:
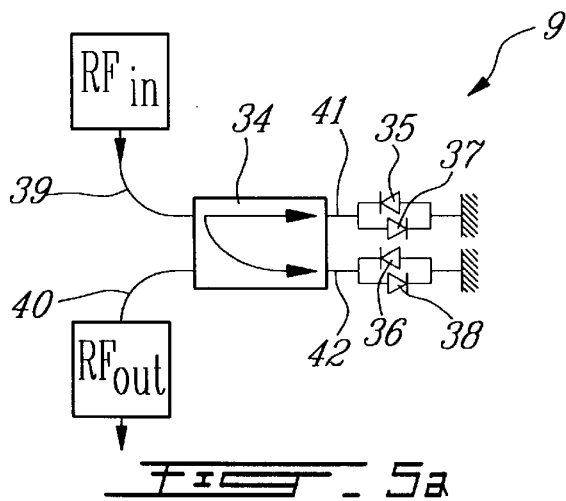
FIG. 5a is the circuit diagram of a first embodiment of the predistorter of the linearizer section of FIG. 2.

The linearizer channel amplifier 200 comprises two main sections, a linearizer section 1 and a controller 53, which will be described in detail below.

(a) The Linearizer Section

A linearizer section such as 1 in FIG. 1 is a non-linear correcting circuit which intentionally introduces distortion in an input signal 2 in order to cancel a distortion subsequently produced by a power amplifier (not shown), without compromising the efficiency of the power amplifier close to saturation. In a preferred embodiment, the input signal 2 is a high crest factor modulated signal in view of cancelling third order intermodulation distortion products as well as high order intermodulation distortion products. In a preferred embodiment, the power amplifiers can be, for example, a Solid State Power Amplifier (SSPA) or a Travelling Wave Tube Amplifier (TWTA).

The linearizer section 1 comprises upstream linearizer 4, serially interconnected variable attenuator 5, input drive amplifier 6, and power limiter 7. The input series circuit including the variable attenuator 5, the input drive amplifier 6 and the power limiter 7 controls the amplitude of the input signal applied to the linearizer 4 to thereby control the moment when the linearizer 4 begins to compress or expand the signal. As will be seen in the following description, the linearizer 4 includes a predistorter 9 which can include Schottky diodes or terminated transistors (MESFET, BJT, HBT, PHMET etc.) requiring a minimum level of signal to proceed with compression or expansion of the signal. These semi-conductor based predistorters could be either biased or non-biased depending on the requirement of the linearizer in terms of AM/AM and AM/PM curves or phase and gain variations over a certain dynamic range. The function of the power limiter 7 is to prevent the input power to exceed the saturation point of the power amplifier (PA) to be linearized; otherwise the intermodulation distortion products (C/I) of the linearized power amplifier (LPA) will be very poor close to saturation specially for high crest-factor modulated input drive conditions such as CDMA, NPR signals.

In accordance with the concept of the linearizer 4 of the invention, the input signal from the power limiter 7 is split into first and second signal portions supplied to two paths 3 and 8 (FIG. 2), respectively. For that purpose, the linearizer 4 comprises an input splitter 13 for splitting the input signal 2 from the power limiter 7 into the first and second signal portions. Although this is not essential, in the preferred embodiment of the present invention, the first and second signal portions are equal in amplitude and power. The input splitter 13 can be, for example, a hybrid coupler or a simple Wilkinson divider.

The first path 3 is a non-linear path and contains a non-linear device such as the predistorter 9 comprising for example Schottky diodes, MESFETs, etc. The first path 3 also contains a controllable variable attenuator 10 connected in series with the predistorter 9. The predistorter 9 produces a non-linear distortion of the first signal portion, while the controllable variable attenuator 10 attenuates this first signal portion. The serially interconnected predistorter 9 and variable attenuator 10 adjust the total power compression or expansion of the first signal portion processed through the non-linear path 3. The non-linear path 3 has therefore one degree of freedom; it acts on the amplitude of the first signal portion only.

The second path 8 is a linear path and includes only linear devices such as a phase shifters, attenuators, etc. In the preferred embodiment illustrated in FIG. 2, the linear path 8 comprises a controllable phase shifter 11 connected in series with a controllable variable attenuator 12. The linear path 8 has two degrees of freedom; it acts on both the amplitude and phase of the second signal portion.

Linearizer 4 further comprises an output splitter 14 acting as a combiner for combining the first and second signal portions derived from the non-linear 3 and linear 8 paths, respectively. The output splitter 14 can be, for example, a hybrid coupler or a simple Wilkinson divider. The combined signal 15 from the output splitter 14 is a predistorted output signal and is supplied to the power amplifier (PA) (not shown) through a variable attenuator 16 and an output drive amplifier 17 to produce a predistorted output signal 100 for cancelling the distortion subsequently produced in the signal by the power amplifier (not shown).

The concept under the linearizer section 1 of FIGS. 1 and 2 is to combine a linear vector produced by path 8 to a non-linear vector produced by path 3. The linear vector is about 180° out of phase with respect to the non-linear vector whereby a very large number of different vectors can be produced. More specifically, the variable phase shifter 11 and the linear attenuator 12 of the linear path 8 act like a vector modulator capable of producing a linear vector which can ideally occupy any point in space. Therefore, the linearizer section 1 can produce a variety of predistortion curves with AM/AM and AM/PM compression or expansion scopes.

Since the output power at saturation of the non-linearized power amplifier (PA) and the obtained linearized power amplifier (LPA) must be the same (see point P in FIG. 6a), the linearizer section 1 advantageously comprises the serially interconnected variable attenuator 16 and drive amplifier 17 to match the output level range of the linearizer 4 to the input level range of the power amplifier (PA).

Therefore, in view of the above description, the linearizer section 1 is controllable through the following five (5) components:

the gain of the input controllable variable attenuator 5 and drive amplifier 6 circuit, called input drive;

the controllable variable attenuator 10;

the controllable variable attenuator 12;

the controllable phase shifter 11; and the gain of the output controllable variable attenuator 16 and drive amplifier 17 circuit, called output gain.

(a.1) The phase shifter.

The phase shifter 11 sets the angle between the linear and non-linear vectors produced by the respective linear 8 and non-linear 3 paths to a value close to 180°. As illustrated in FIG. 3, the phase shifter 11 can be a reflective phase shifter. When the power amplifier is a microwave power amplifier, the reflective phase shifter 11 may comprise a hybrid coupler 18 comprising a RF input 21 constituting the input of the phase shifter 11, a RF output 22 constituting the output of the phase shifter 11, a direct port 19 and a coupled port 20 both terminated by the same Varactor diode circuits.

More specifically, a Varactor diode 23 has a grounded anode and a cathode connected to direct port 19. In the same manner, a Varactor diode 27 has a grounded anode and a cathode connected to direct port 19. The cathodes of the Varactor diodes 23 and 27 are connected to the direct port 19 through a quarter-wavelength microstrip line circuit 25.

In the same manner, a Varactor diode 24 has a grounded anode and a cathode connected to coupled port 20. A second Varactor diode 28 has a grounded anode and a cathode connected to coupled port 20. Again, the cathodes of the Varactor diodes 24 and 28 are connected to the coupled port 20 through a quarter-wavelength microstrip line circuit 26

The quarter-wavelength microstrip line circuits 25 and 26 are designed to form a reflective structure that flattens the curve of relative phase shift produced by the phase shifter 11 over the frequency bandwidth of interest; this relative phase shift can reach 360° depending on the type of Varactors diodes being used. A dc (direct current) control circuit (not shown) is used to bias the Varactor diodes 23, 24, 27 and 28 and thereby adjust the angular phase shift as required.

(a.2) The attenuator.

When the power amplifier is a microwave power amplifier, the attenuators 5, 10, 12 and 16 can be made of the same circuit as the phase shifter of FIG. 3, but with the Varactor diodes replaced by PIN (Positive-Intrinsic-Negative) diodes 30–33 (FIG. 4).

Again, a dc control circuit (not shown) is used to bias the PIN diodes 30, 31, 32 and 33 and thereby adjust the attenuation produced by the attenuator.

In all the devices that use a hybrid coupler such as 18 and 29, the latter can be a branch line coupler, an edge coupler or a Lange coupler.

(a.3) The predistorter.

Figure 5B:
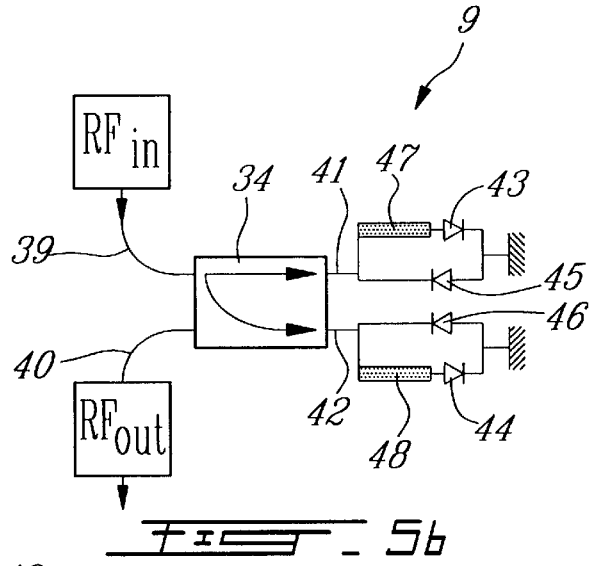
FIG. 5b is the circuit diagram of a second embodiment of the predistorter of the linearizer section of FIG. 2.
Figure 5C:
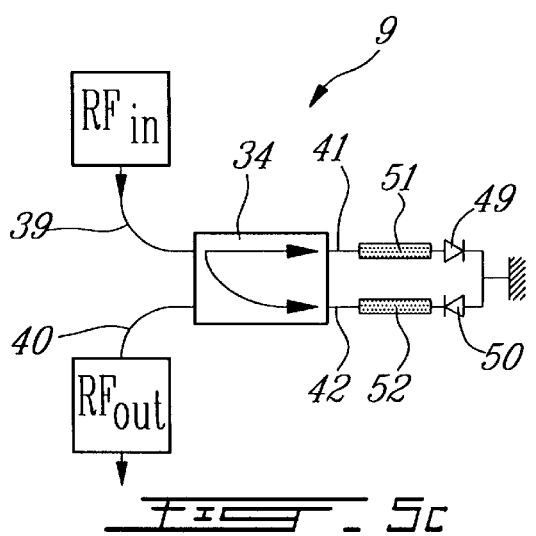
FIG. 5c is the circuit diagram of a third embodiment of the predistorter of the linearizer section of FIG. 2.
Figure 5D:
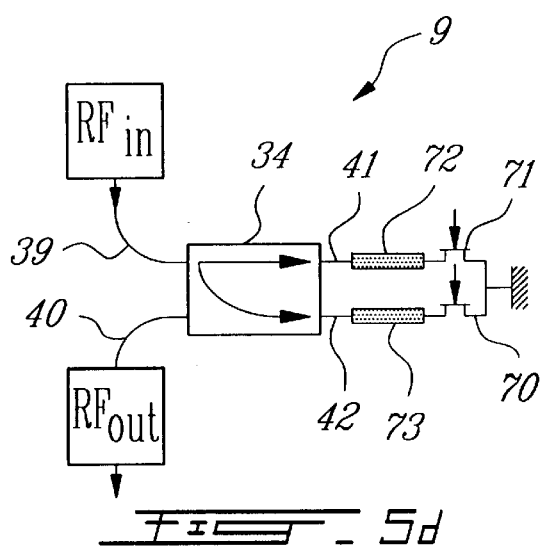
FIG. 5d is the circuit diagram of a fourth embodiment of the predistorter of the linearizer section of FIG. 2.

As shown in FIGS. 5a, 5b, 5c and 5d, when the power amplifier is a microwave power amplifier, the predistorter 9 is built up with a hybrid coupler 34 having a RF input 39 constituting the input of the predistorter 9, a RF output 40 constituting the output of the predistorter 9, and direct 41 and coupled 42 ports both terminated by one of the following circuits:

two Schottky diodes 35, 36 and 37, 38 connected in head-to-tail configuration without matching circuit (FIG. 5a) between the direct or coupled port and the ground;

as illustrated in FIG. 5b, two Schottky diodes 43, 44 and 45, 46 connected in head-to-tail configuration between the direct or coupled port and the ground, with an additional matching circuit 47 (microstrip line circuit) connected between the anode of diode 43 and the direct port 41 and designed to flatten the curve of distortion produced by predistorter 9 over the frequency bandwidth of interest, and with an additional matching circuit 48 (microstrip line circuit) connected between the anode of diode 46 and the coupled port 42 and designed to flatten the curve of distortion produced by predistorter 9 over the frequency bandwidth of interest;

as illustrated in FIG. 5c, a first Schottky diode 49 having a cathode grounded and an anode connected to the direct port 41 through a matching circuit 51 (microstrip line circuit) and a DC return (not represented in FIG. 5c), and a second Schottky diode 50 having an anode connected to the ground, a cathode connected to the coupled port 42 through a matching circuit 52 (microstrip line circuit), and a DC return (not represented in FIG. 5c); the diodes 49 and 50 are arranged in head-to-tail configuration and the function of the matching circuit 51, 52 is to flatten the curve of distortion produced by predistorter 9 over the frequency bandwidth of interest; and as illustrated in FIG. 5d, two terminated biased-transistors 70, 71 connected between the direct and coupled ports of the hybrid junction and the ground; a matching circuits 72; 73 (microstrip line circuit) is also provided between the terminated biased transistor 71; 70 and the direct 41; coupled 42 port wherein the function of the matching circuits 72 and 73 is to flatten the curve of distortion produced by predistorter 9 over the frequency bandwidth of interest.

The choice of a predistorter configuration depends on what kind of power amplifier is to be linearized. An initial criteria is the total gain compression (AM/AM distortion) and phase shift variation (AM/PM distortion) of the power amplifier. The adjustment of the predistorter parameters is required to fit the ideal predistortion curves as detailed below.

(b) The Controller.

Since the characteristics of a microwave power amplifier significantly change with temperature, the linearizer section 1 (FIG. 1) needs to maintain the overall performance of linearity of the system and follow the amplifier changes. For that purpose, a controller 53 is provided. This controller 53 comprises a processor 54 (CPU), a look-up table 55 stored in memory banks 64, a serial interface 56, a digital-to-analog (D/A) converter 57, and a signal conditioner 58.

Figures 6A, 6B:
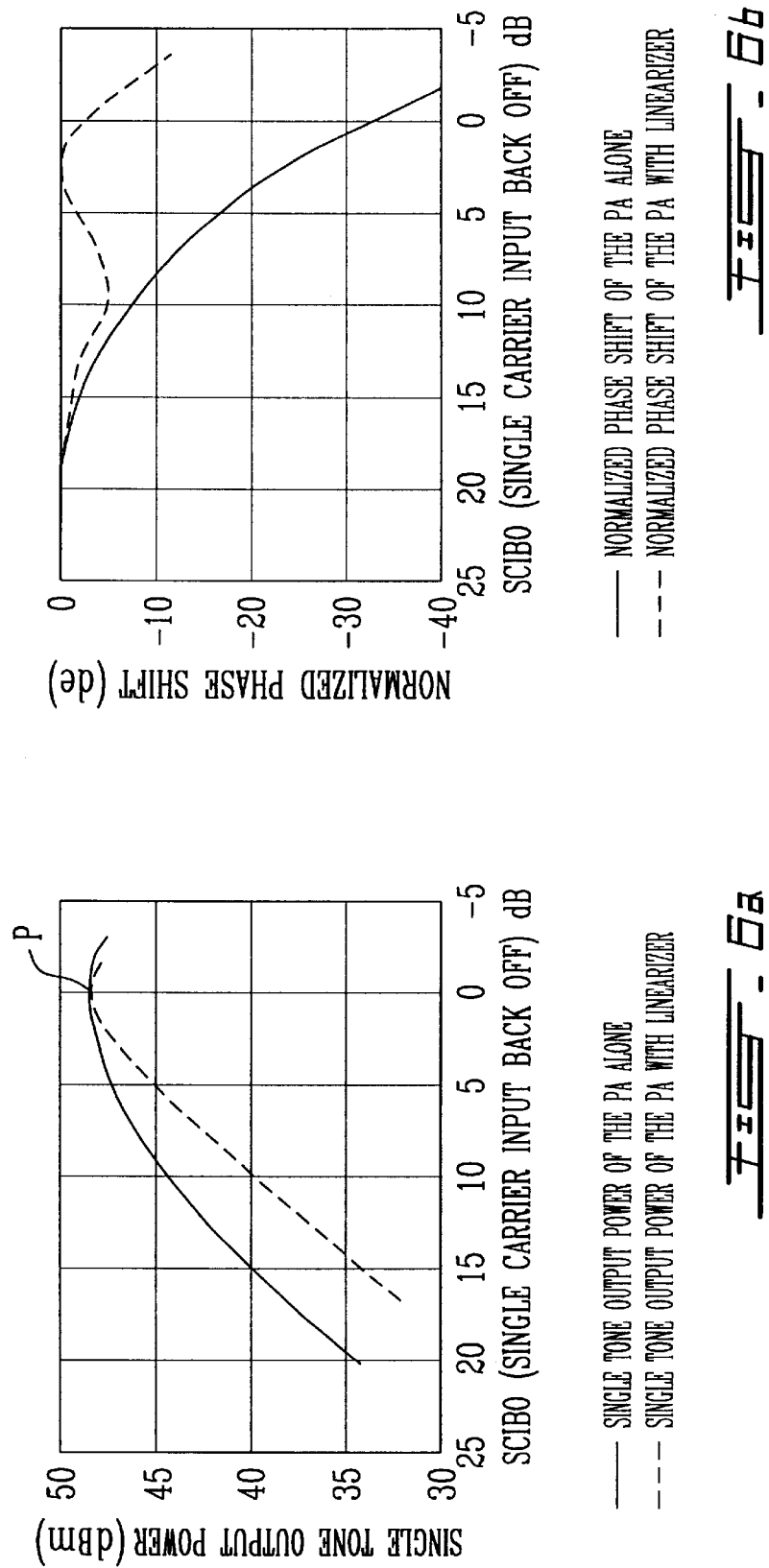
FIG. 6a is a graph showing typical output power vs. single carrier input back off curves for a power amplifier and a linearized power amplifier.
FIG. 6b is a graph showing typical normalized phase shift vs. single carrier input back off curves for a power amplifier and a linearized power amplifier.
Figure 7B:
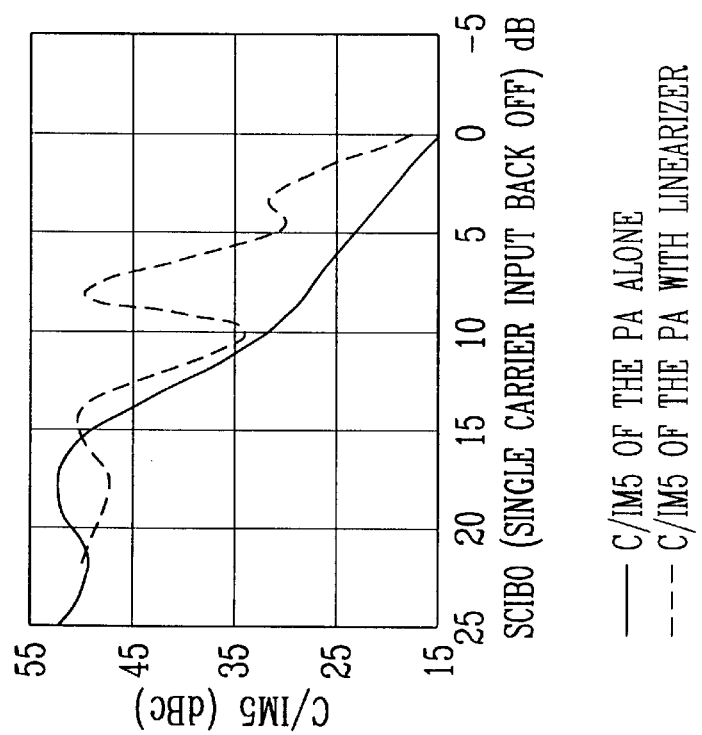
FIG. 7b is a graph showing typical improvement of the fifth order intermodulation distortion of the power amplifier and linearized power amplifier.
Figure 7A:
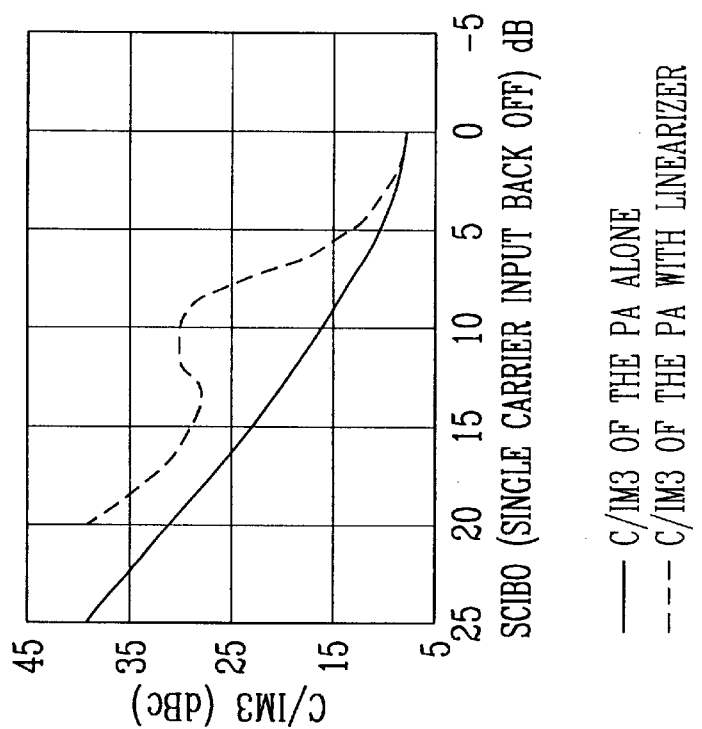
FIG. 7a is a graph showing typical improvement of the third order intermodulation distortion of the power amplifier and linearized power amplifier.

A network analyser (not shown) is used to measure output power vs. single carrier input back off and normalized phase shift vs. single carrier input back off curves of the non-linearized power amplifier (see curves PA of FIGS. 6a and 6b). Note that the curves of FIGS. 6a and 6b can be derived to obtain AM/AM and AM/PM curves. From these data, a PC (Personal Computer) can be programmed for calculating ideal predistortion curves and corresponding predistortion control parameters to be applied to the linearizer section 1 in order to obtain the closest AM/AM and AM/PM to those of an ideal limiter for the linearized amplifier as illustrated in FIGS. 6a and 6b. In doing so, we decrease the third, fifth, etc., inter-modulation products simultaneously as illustrated in FIGS. 7a and 7b.

In the end, the problem of linearizing the power amplifier is considered herein as a complex curve-fitting problem having as objective function the complex gain of an ideal limiter, and not as a problem of minimising the third order inter-modulation distortion products only.

These predistortion control parameters are stored in the look-up table 55 for different temperatures of operation of the power amplifier. Of course, the predistortion control parameters stored in the look-up table 55 are suitable for controlling through a D/A converter 57 and a signal conditioner 58 the variable attenuator 5 through line 59, the variable attenuator 10 through line 60, the phase shifter 11 through line 61, the variable attenuator 12 through line 62, and the variable attenuator 16 through line 63, for adjusting the linearizer section 1 to compensate for the non-linearities of a wide range of microwave power amplifiers over a wide range of environmental conditions. Signal conditioner 58 is in fact a buffer circuit for interfacing the voltage level at the output of the D/A converter 57 with the voltage level of the above described diodes of the attenuators and phase shifter; this will protect both the D/A converter 57 and the diodes.

Figure 10A:
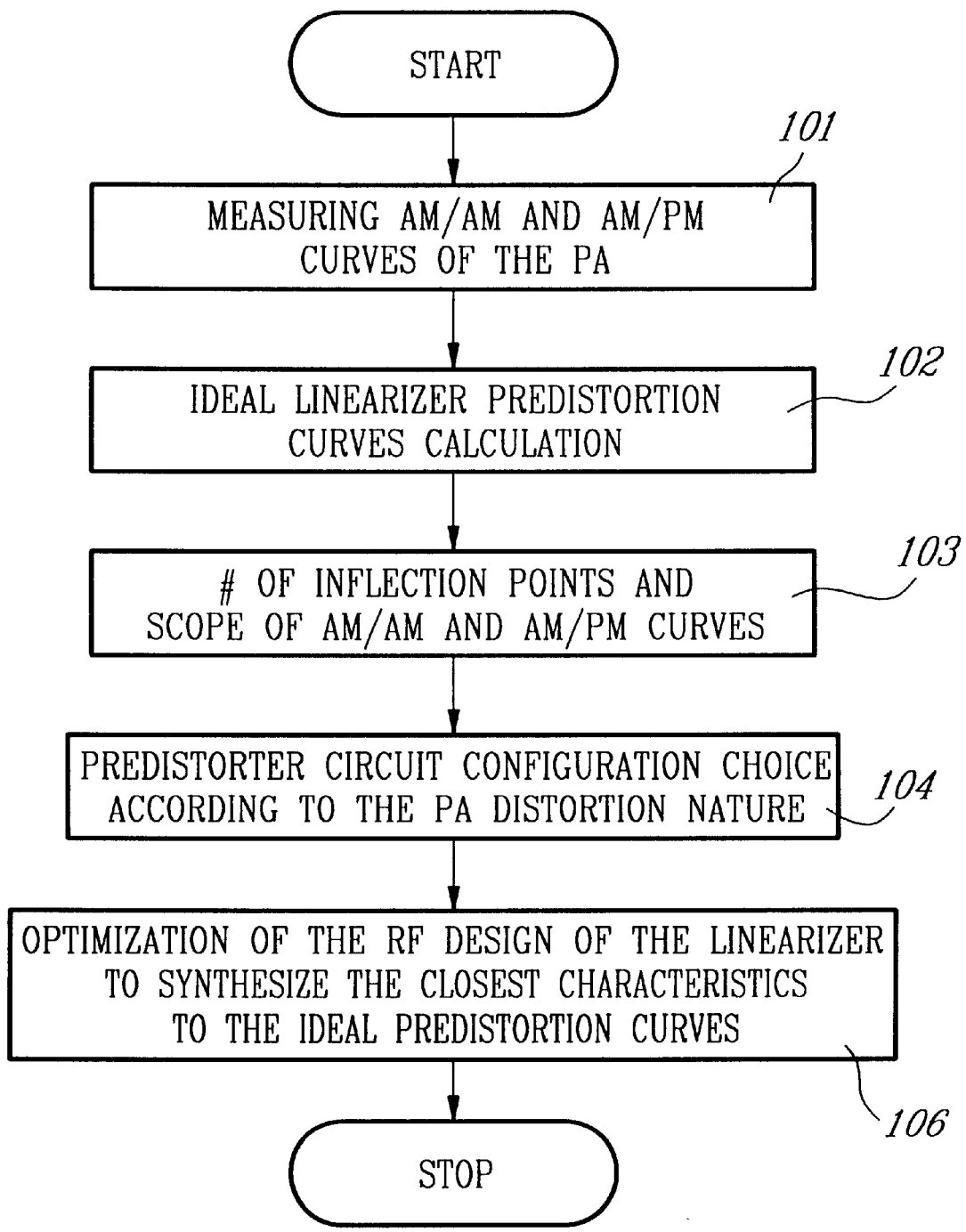
FIG. 10a is a block diagram of an algorithm for the design of the linearizer channel amplifier in accordance with an embodiment of the invention.

FIG. 10a is a block diagram of the design procedure of the linearizer channel amplifier 200. The first step (101) in the design of the linearizer channel amplifier 200 is to determine the AM/AM and AM/PM characteristics of the power amplifier. At step 102, ideal linearizer predistortion curves are calculated. The ideal linearizer predistortion curves are generally represented as the inverse of AM/AM and AM/PM curves. By determining the number of inflection points and the slope of the downward extending portion of the AM/AM and AM/PM curves (also referred to as the distortion nature) (step 103), a user can choose (step 104) the predistorter 9 circuit configuration from, for example, those proposed in FIGS. 5a to 5d. In an exemplary embodiment, for a power amplifier showing only one inflection point in its AM/AM curve (usually seen in TWTs), predistorter 9 circuits comprising diodes (FIGS. 5a, 5b and 5c) produce desired results. If the slope in the AM/AM curve is abrupt, predistorter circuits of FIGS. 5a and 5b will be chosen. If the slope is not abrupt, predistorter circuits of FIG. 5c will be a better choice. For a power amplifier showing more than one inflection point in its AM/AM curve (usually seen in SSPAs), predistorter 9 circuits comprising transistors (FIG. 5d) produce desired results.

In the last design step (step 106), the RF design of the linearizer section 1 components (i.e., the predistorter 9 and its components (see FIGS. 5a to 5d); the attenuators 5, 10, 12, 15 and their components (see FIG. 4); the amplifiers 6 and 17; the limiter 7; the splitter 13; the combiner 14; and the phase shifter 11 and its components (see FIG. 3)) to synthesise the closest characteristics to the ideal predistortion curves over the required temperature range is carried out. In a preferred embodiment of the invention, this optimization calculation can be performed using well-known least square algorithms.

Figure 10B:
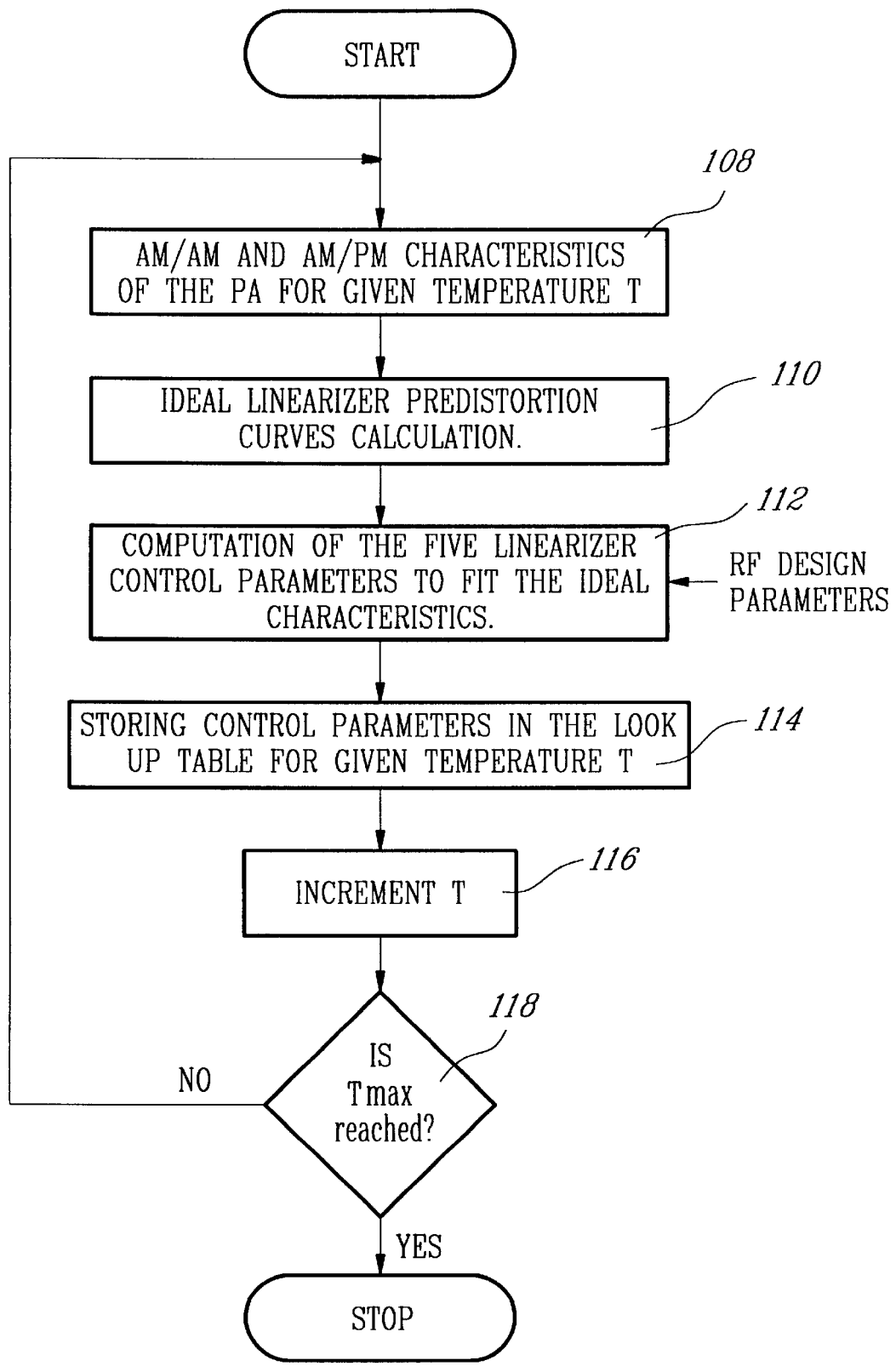
FIG. 10b is a block diagram of an algorithm for the alignment/calibration of the linearizer channel amplifier in accordance with an embodiment of the invention.

FIG. 10b is a block diagram of the alignment/calibration procedure of the linearizer channel amplifier 200. The first step (108) in the alignment/calibration of the linearizer channel amplifier 200 is to determine the AM/AM and AM/PM characteristics of the power amplifier for an initial temperature $T_i$. The initial temperature $T_i$ (for example, the lowest in a given temperature range) as well as $T_{max}$ (for example, the highest in a given temperature range) are chosen on the basis of the particular temperature specifications in which the power amplifier will be used. The temperature range could be, for example, −30° C. to 80° C. for military applications. At step 110, ideal linearizer predistortion curves are calculated. The ideal linearizer predistortion curves are generally represented as the inverse of AM/AM and AM/PM curves.

The five linearizer section 1 control parameters for controlling the variable attenuator 5, the variable attenuator 10, the phase shifter 11, the variable attenuator 12 and the variable attenuator 16, are then calculated at step 112 for $T_i$. In order to perform these calculations, the RF design parameters, determined in FIG. 10a, are used. These calculations can be performed using well-known least square algorithms. At step 114, the control parameters for $T_i$ are stored in look-up table 64. Temperature $T_i$ is then incremented (step 116) and, at step 118, it is determined whether $T_{max}$ is reached. If it is not, the alignment and calibration procedure continues, returns to step 108, and performs the subsequent steps with a new temperature value T. When $T_{max}$ is reached, the procedure stops.

One skilled in the art will understand that other embodiments of steps 116 and 118 are possible. For example, the initial temperature $T_i$ could be the highest temperature in the temperature range and the temperature could be decremented until $T_{min}$ is reached. In another example, the temperature increments (step 116) could take on different values for each iteration depending on the rate of change, in relation to the change in temperature, of the AM/AM and AM/PM curves.

As shown in FIG. 1, it is possible to modify or monitor the alignment/calibration of the linearizer channel amplifier 200 through the serial interface 56 input.

In operation, the processor (CPU) 54 measures the temperature of the power amplifier through the signal conditioner 58 and the D/A converter 57, selects predistortion control parameters of look-up table 55 in relation to the measured temperature, and finally applies these predistortion parameters to the variable attenuator 5, the variable attenuator 10, the phase shifter 11, the variable attenuator 12, and the variable attenuator 16 to linearize the power amplifier, i.e. to produce a predistorted output signal 100 which cancels the distortion subsequently produced by the microwave power amplifier.

Therefore, the function of the controller 53 is to provide a set of predistortion control parameters for controlling the attenuators 5, 10, 12 and 16 and the phase shifter 11 in relation to the temperature of operation of the power amplifier. Controller 53 can be a FPGA (Fast Programmable Gate Array), a DSP (Digital Signal Processor) or a PIC (Programmable Integrated Controller), etc., and can be interfaced with a PC (Personal Computer) through the serial interface 56 to automatically adjust the predistortion curves directly or via an optimisation program that sets the predistortion control parameters of look-up table 55 to values that minimise the difference between the ideal predistortion curve and the obtained predistortion curve. The processor 54 (CPU) may include a program that tries to maintain good linearity of the linearized power amplifier over a wide range of environmental operating conditions.

The preferred embodiment of the present invention has been described in relation to control of the linearizer section 1 in response to temperature. Such control can of course be made in relation to other environmental operating conditions affecting the linearity of the microwave power amplifiers.

Also, application of the concept of the present invention is not limited to microwave power amplifiers but to any other type of amplifier requiring compensation for environmental conditions affecting distortion produced by the amplifier, and therefore linearity of the amplifier.

Figure 8:
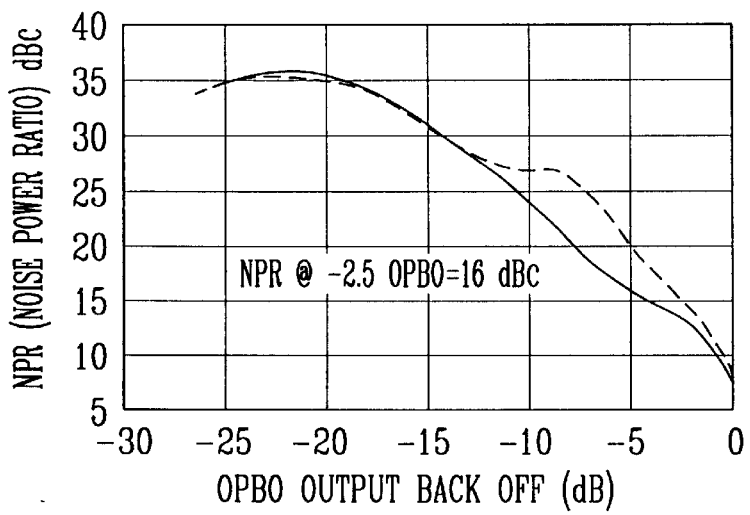
FIG. 8 is a graph showing typical improvement in noise power ratio of a power amplifier.

The results shown in FIGS. 6 to 8 concern a TWTA working at C-band frequencies but are typical for any TWTA linearity improvement using the present invention.

FIGS. 6a and 6b are typical output power vs. single carrier input back off and normalized phase shift vs. single carrier input back off curves (from which AM/AM and AM/PM curves can be obtained) of a TWTA (Travelling Wave Tube Amplifier) before and after linearization. FIGS. 7a and 7b illustrate the C/IM3 (carrier to third order Inter-modulation product ratio) and C/IM5 (carrier to fifth order Inter-modulation product ratio) improvement.

The noise power ratio (NPR) is a figure-of-merit for transmit amplifier linearity and is commonly used when the input signals contain multiple information channels with digital communications links. For digital communication channels, where the signal inputs contain large amounts of individual band pass signals, NPR performance using noise-like inputs is more realistic than two-tone non-linearity evaluations. FIG. 8 shows the NPR of the TWTA with and without linearization relative to the total average available output power. The test signal is a 50 MHz band limited noise-like signal with an inside 500 kHz band reject notch. The NPR is the ratio between the average power density inside the notch relative to the average power density outside the notch. The peak-to-average ratio of the test signal (crest factor) is 12 dB.

Optimal performances are obtained between 6 and 10 dB output-back-off (OPBO) with this signal. However, the control parameters of the linearizer can be adjusted to customise/enhance the NPR performances in accordance with the characteristics of the test signal and the average power back off operating point.

Figure 9:
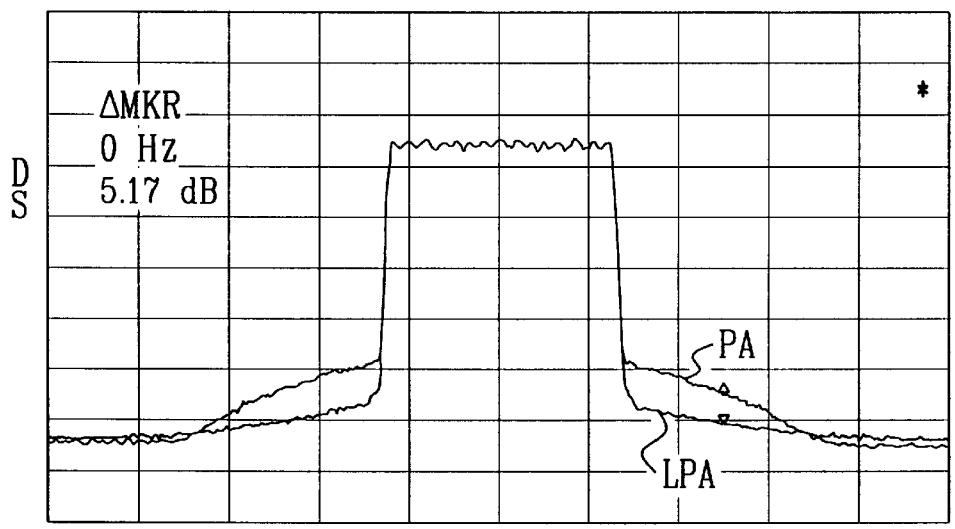
FIG. 9 is a graph showing typical improvement in Adjacent Channel Power (ACP) of a class A GaAsFET SSPA (gallium arsenide FET solid state power amplifier) driven by a Wideband-CDMA signal.

To demonstrate the suitability of the proposed linearizer for SSPAs, a class A GaAsFET based SSPA was linearized using an L band prototype linearizer, while a high crest factor W-CDMA type of signal was driving the SSPA. FIG. 9 shows performance of the SSPA with and without linearization at 10 dB OPBO. At the marker Δ, the upper line shows performance without linearization and the lower line is with linearization. It is clear that the linearizer typically reduces the adjacent channel power (ACP) by 5 to 7 dB, which is a significant improvement in wireless PCS (Personal Communication Services) applications Although the present invention has been described hereinabove by way of a preferred embodiment thereof, this embodiment can be modified at will, within the scope of the appended claims, without departing from the spirit and nature of the subject invention.

What is claimed is:

1. A linearizer channel amplifier for use in conjunction with a microwave power amplifier, comprising a linearizer which comprises:
   i) a splitter to split an input signal into first and second signal portions;
   ii) a first controllable signal-distorting and amplitude-adjusting path to distort and adjust the amplitude of said first signal portion, wherein said first path comprises a predistorter connected in series with a variable attenuator, and wherein the predistorter comprises:
      a) a hybrid coupler comprising a RF input constituting an input of the predistorter, a RF output constituting an output of the predistorter, a direct port, and a coupled port;
      b) a first pair of Schottky diodes connected in head-to-tail configuration between the direct port and the ground; and
      c) a second pair of Schottky diodes connected in head-to-tail configuration between the coupled port and the ground;
   iii) a second controllable phase-shifting and amplitude-adjusting path to phase-shift and adjust the amplitude of said second signal portion; and
   iv) a combiner to combine the distorted and amplitude-adjusted first signal portion and the phase-shifted and amplitude-adjusted second signal portion to form a predistorted output signal;
whereby the predistorted output signal cancels a distortion subsequently produced by the power amplifier.

2. A linearizer channel amplifier for use in conjunction with a microwave power amplifier, comprising a linearizer which comprises:
   i) a splitter to split an input signal into first and second signal portions,
   ii) a first controllable signal-distorting and amplitude-adjusting path to distort and adjust the amplitude of said first signal portion, wherein said first path comprises a predistorter connected in series with a variable attenuator, and wherein the predistorter comprises:
      a) a hybrid coupler comprising a RF input constituting an input of the predistorter, a RF output constituting an output of the predistorter, a direct port, and a coupled port;
      b) first and second Schottky diodes connected in head-to-tail configuration between the direct port and the ground, one of said first and second diodes having an anode connected to the direct port;
      c) a first matching line circuit through which the anode of said one of the first and second diodes is connected to the direct port;
      d) third and fourth Schottky diodes connected in head-to-tail configuration between the coupled port and the ground, one of said third and fourth diodes having an anode connected to the coupled port; and
      e) a second matching line circuit through which the anode of said one of the third and fourth diodes is connected to the coupled port;
   iii) a second controllable phase-shifting and amplitude-adjusting path to phase-shift and adjust the amplitude of said second signal portion; and
   iv) a combiner to combine the distorted and amplitude-adjusted first signal portion and the phase-shifted and amplitude-adjusted second signal portion to form a predistorted output signal;
whereby the predistorted output signal cancels a distortion subsequently produced by the power amplifier.

3. A linearizer channel amplifier for use in conjunction with a microwave power amplifier, comprising a linearizer which comprises:
   i) a splitter to split an input signal into first and second signal portions;
   ii) a first controllable signal-distorting and amplitude-adjusting path to distort and adjust the amplitude of said first signal portion, wherein said first path comprises a predistorter connected in series with a variable attenuator, and wherein the predistorter comprises:
      a) a hybrid coupler comprising a RF input constituting an input of the predistorter, a RF output constituting an output of the predistorter, a direct port, and a coupled port;
      b) a first Schottky diode connected between the direct port and the ground;
      c) a second Schottky diode connected between the coupled port and the ground, said first and second Schottky diodes being connected in head-to-tail configuration;
      d) a first matching line circuit interposed between the direct port and the first Schottky diode; and
      e) a second matching line circuit interposed between the coupled port and the second Schottky diodes;
   iii) a second controllable phase-shifting and amplitude-adjusting path to phase-shift and adjust the amplitude of said second signal portion; and
   iv) a combiner to combine the distorted and amplitude-adjusted first signal portion and the phase-shifted and amplitude-adjusted second signal portion to form a predistorted output signal;
whereby the predistorted output signal cancels a distortion subsequently produced by the power amplifier.

4. A linearizer channel amplifier for use in conjunction with a microwave power amplifier, comprising a linearizer which comprises:
   i) a splitter to split an input signal into first and second signal portions;
   ii) a first controllable signal-distorting and amplitude-adjusting path to distort and adjust the amplitude of said first signal portion, wherein said first path comprises a predistorter connected in series with a variable attenuator, and wherein the predistorter comprises:
      a) a hybrid coupler comprising a RF input constituting an input of the predistorter, a RF output constituting an output of the predistorter, a direct port, and a coupled port;
      b) a first terminated biased-transistor connected between the direct port and the ground;
      c) a second terminated biased-transistor connected between the coupled port and the ground;
      d) first matching line circuit interposed between the direct port and the first terminated biased-transistor; and e) a second matching line circuit interposed between the coupled port and the second terminated biased-transistors;

iii) a second controllable phase-shifting and amplitude-adjusting path to phase-shift and adjust the amplitude of said second signal portion; and iv) a combiner to combine the distorted and amplitude-adjusted first signal portion and the phase-shifted and amplitude-adjusted second signal portion to form a predistorted output signal;

whereby the predistorted output signal cancels a distortion subsequently produced by the power amplifier.

5. A linearizer channel amplifier for use in conjunction with a reflective power amplifier, comprising a linearizer which comprises:

i) a splitter to split an input signal into first and second signal portions;

ii) a first controllable signal-distorting and amplitude-adjusting path to distort and adjust the amplitude of said first signal portion, wherein said first path comprises a predistorter connected in series with a variable attenuator, and wherein the variable attenuator is a reflective variable attenuator comprising:

a) a hybrid coupler comprising a RF input constituting an input of the variable attenuator, a RF output constituting an output of the variable attenuator, a direct port, and a coupled port;

b) first and second PIN diodes connected between the direct port and the ground, said first and second PIN diodes each comprising an anode connected to the direct port and a cathode connected to the ground;

c) a first matching line circuit interposed between the direct port and the anode of the first and second PIN diodes;

d) third and fourth PIN diodes connected between the coupled port and the ground, said third and fourth PIN diodes each comprising an anode connected to the coupled port and a cathode connected to the ground; and e) a second matching line circuit interposed between the coupled port and the anodes of the third and fourth PIN diodes;

iii) a second controllable phase-shifting and amplitiude-adjusting path to phase-shift and adjust the amplitude of said second signal portion; and iv) a combiner to combine the distorted and amplitude-adjusted first signal portion and the phase-shifted and amplitude-adjusted second signal portion to form a predistorted output signal;

whereby the predistorted output signal cancels a distortion subsequently produced by the power amplifier.

6. A linearizer channel amplifier for use in conjunction with a microwave power amplifier, comprising a linearizer which comprises:

i) a splitter to split an input signal into first and second signal portions;

ii) a first controllable signal-distorting and amplitude-adjusting path to distort and adjust the amplitude of said first signal portion;

iii) a second controllable phase-shifting and amplitude-adjusting path to phase-shift and adjust the amplitude of said second signal portion, wherein said second path comprises a phase shifter connected in series with a variable attenuator, and wherein the phase shifter is a reflective phase shifter comprising:

a) a hybrid coupler comprising a RF input constituting an input of the phase shifter, a RF output constituting an output of the phase shifter, a direct port, and a coupled port;

b) first and second Varactor diodes connected between the direct port and the ground, said first and second Varactor diodes each comprising a cathode connected to the direct port and an anode connected to the ground;

c) a first matching line circuit interposed between the direct port and the cathodes of the first and second Varactor diodes;

d) third and fourth Varactor diodes connected between the coupled port and the ground, said third and fourth Varactor diodes each comprising a cathode connected to the coupled port and an anode connected to the ground; and e) a second matching line circuit interposed between the coupled port and the cathodes of the third and fourth Varactor diodes;

iv) a combiner to combine the distorted and amplitude-adjusted first signal portion and the phase-shifted and amplitude-adjusted second signal portion to form a predistorted output signal;

whereby the predistorted output signal cancels a distortion subsequently produced by the power amplifier.

7. A linearizer channel amplifier for use in conjunction with a microwave power amplifier, comprising a linearizer which comprises:

i) a splitter to split an input signal into first and second signal portions;

ii) a first controllable signal-distorting and amplitude-adjusting path to distort and adjust the amplitude of said first signal portion;

iii) a second controllable phase-shifting and amplitude-adjusting path to phase-shift and adjust the amplitude of said second signal portion, wherein said second path comprises a phase shifter connected in series with a variable attenuator, and wherein the variable attenuator is a reflective variable attenuator comprising:

a) a hybrid coupler comprising a RF input constituting an input of the variable attenuator, a RF output constituting an output of the variable attenuator, a direct port, and a coupled port;

b) first and second PIN diodes connected between the direct port and the ground, said first and second PIN diodes each comprising an anode connected to the direct port and a cathode connected to the ground;

c) a first matching line circuit interposed between the direct port and the anodes of the first and second PIN diodes;

d) third and fourth PIN diodes connected between the coupled port and the ground, said third and fourth PIN diodes each comprising an anode connected to the coupled port and a cathode connected to the ground; and e) a second matching line circuit interposed between the coupled port and the anodes of the third and fourth PIN diodes;

iv) a combiner to combine the distorted and amplitude-adjusted first signal portion and the phase-shifted and amplitude-adjusted second signal portion to form a predistorted output signal;

whereby the predistorted output signal cancels a distortion subsequently produced by the power amplifier.

8. A linearizer channel amplifier for use in conjunction with a power amplifier, comprising:

a) a controllable input variable-attenuator, drive-amplifier and power-limiter circuit comprising a first controllable variable attenuator, an input drive amplifier and a power limiter connected in series to attenuate an input signal, amplify the input signal and limit the power of said input signal;

b) a linearizer comprising:
  i) a splitter to split into first and second signal portions the attenuated, amplified and power-limited input signal from the input variable-attenuator, drive-amplifier and power-limiter circuit;
  ii) a first controllable signal-distorting and amplitude-adjusting path to distort and adjust the amplitude of said first signal portion, wherein said first path is a non-linear path and comprises a predistorter connected in series with a second controllable variable attenuator;
  iii) a second controllable phase-shifting and amplitude-adjusting path to phase-shift and adjust the amplitude of said second signal portion, wherein said second path is linear and comprises a controllable phase shifter connected in series with a third controllable variable attenuator; and
  iv) a combiner to combine the distorted and amplitude-adjusted first signal portion and the phase-shifted and amplitude-adjusted second signal portion to form a predistorted output signal;

c) a controllable output variable-attenuator and drive-amplifier circuit comprising a fourth controllable variable attenuator connected in series with an output drive amplifier to attenuate the predistorted output signal and amplify said predistorted output signal before supplying said predistorted output signal to said power amplifier; and d) a controller to control the first and second paths in view of distorting and amplitude-adjusting the first signal portion and phase-shifting and amplitude-adjusting the second signal portion so as to produce a predistorted output signal which cancels a distortion subsequently produced by the power amplifier.

9. A linearizer channel amplifier for use in conjunction with a power amplifier, comprising:
  i) a controllable input variable-attenuator, drive-amplifier and power-limiter circuit to attenuate an input signal, amplify the input signal and limit the power of said input signal;
  ii) a linearizer comprising:
    a) a splitter to split into first and second signal portions the attenuated, amplified and power-limited input signal from the input variable-attenuator, drive-amplifier and power-limiter circuit;
    b) a first controllable signal-distorting and amplitude-adjusting path to distort and adjust the amplitude of said first signal portion;
    c) a second controllable phase-shifting and amplitude-adjusting path to phase-shift and adjust the amplitude of said second signal portion; and
    d) a combiner to combine the distorted and amplitude-adjusted first signal portion and the phase-shifted and amplitude-adjusted second signal portion to form a predistorted output signal;
  iii) a controllable output variable-attenuator and drive-amplifier circuit to attenuate the predistorted output signal and amplify said predistorted output signal before supplying said predistorted output signal to said power amplifier; and
  iv) a digital controller comprising:
    A) a detector of the level of a condition of operation of the power amplifier;
    B) a selector of predistortion control parameters in relation to the measured level of the condition of operation; and
    C) an application of the selected predistortion control parameters to the controllable input and output circuits and to the first and second controllable paths in view of distorting and amplitude-adjusting the first signal portion and phase-shifting and amplitude-adjusting the second signal portion so as to produce a predistorted output signal which cancels a distortion subsequently produced by said power amplifier.

10. A linearizer channel amplifier as recited in claim 4, wherein said predistortion control parameter selector comprises:
  a) a look-up table for storing predistortion control parameters associated to different levels of said condition of operation; and
  b) predistortion control parameter selecting means connected to the look-up table and responsive to the measured level of the condition of operation.

11. A linearizer channel amplifier for use in conjunction with a power amplifier, comprising:
  i) a controllable input variable-attenuator, drive-amplifier and power-limiter circuit comprising a first controllable variable attenuator, an input drive amplifier and a power limiter connected in series to attenuate an input signal, amplify the input signal and limit the power of said input signal;
  ii) a linearizer comprising:
    I) a splitter to split into first and second signal portions the attenuated, amplified and power-limited input signal from the input variable-attenuator, drive-amplifier and power-limiter circuit;
    II) a first controllable signal-distorting and amplitude-adjusting path to distort and adjust the amplitiude of a first signal portion, wherein said first path is a non-linear path and comprises a predistorter connected in series with a second controllable variable attenuator;
    III) a second controllable phase-shifting and amplitude-adjusting path to phase-shift and adjust the amplitude of said second signal portion, wherein said second path is linear and comprises a controllable phase shifter connected in series with a third controllable variable attenuator; and
    IV) a combiner to combine the distorted and amplitude-adjusted first signal portion and the phase-shifted and amplitude-adjusted second signal portion to form a predistorted output signal;
  iii) a controllable output variable-attenuator and drive-amplifier circuit comprising a fourth controllable variable attenuator connected in series with an output drive amplifier to attenuate the predistorted output signal and amplify said predistorted output signal before supplying said predistorted output signal to said power amplifier;
  iv) a digital controller comprising:
    a) a processor responsive to the level of a temperature of operation of the power amplifier through an interface;
    b) a look-up table to store predistortion control parameters related to different levels of said temperature of operation; and
    c) said processor being connected to the look-up table to select predistortion control parameters in relation to the measured temperature level, and to apply through a digital-to-analog converter and a signal conditioner the selected predistortion control parameters to the first, second, third and fourth controllable variable attenuators and to the controllable phase shifter in view of of distorting and amplitude-adjusting the first signal portion and phase-shifting and amplitude-adjusting the second signal portion so as to produce a predistorted output signal which cancels a distortion subsequently produced by said power amplifier.

* * * * *